United States Patent [19]

Sacarisen et al.

[11] Patent Number: 4,792,835
[45] Date of Patent: Dec. 20, 1988

[54] MOS PROGRAMMABLE MEMORIES USING A METAL FUSE LINK AND PROCESS FOR MAKING THE SAME

[75] Inventors: Stephen P. Sacarisen, Garland; Gene E. Blankenship, Richardson; Rajiv R. Shah, Plano; Toan Tran; David J. Myers, both of Dallas; Johnson J. Lin, Plano; Steve Thompson, Richmond, all of Tex.

[73] Assignee: Texas Instruments Incorporated, Dallas, Tex.

[21] Appl. No.: 938,226

[22] Filed: Dec. 5, 1986

[51] Int. Cl.⁴ .................... H01L 29/78; H01L 21/00; B44C 1/22; C23F 1/02
[52] U.S. Cl. .................... 357/23.6; 156/644; 156/653; 156/656; 156/657; 156/659.1; 357/41; 357/49; 357/67; 357/71; 437/34; 437/56; 437/62; 437/192; 437/245
[58] Field of Search .................... 29/571, 577 R, 591; 156/644, 652, 653, 656, 657, 659.1, 661.1, 662, 663; 148/1.5, 187; 427/88; 357/23.1, 23.6, 41, 42, 44, 49, 67, 71; 437/29, 30, 34, 40, 48, 52, 56, 57, 58, 59, 61, 62, 187, 192, 194, 228, 238, 245

[56] References Cited

U.S. PATENT DOCUMENTS

| | | | |
|---|---|---|---|
| 4,420,504 | 12/1983 | Cooper et al. | 29/591 X |
| 4,536,948 | 8/1985 | Velde et al | 29/591 X |
| 4,628,590 | 12/1986 | Udo et al. | 29/571 X |
| 4,647,340 | 3/1987 | Szluk et al. | 156/653 X |

Primary Examiner—William A. Powell
Attorney, Agent, or Firm—Thomas R. Fitzgerald; N. Rhys Merrett; Melvin Sharp

[57] ABSTRACT

A process for making a metal fuse link in a MOS or CMOS process which includes depositing a refractory metal or metal alloy over an already deposited multi-level oxide and patterning the deposited metal or metal alloy so that it has a fusing segment between and integral with expanded segments such that the length and cross sectional area of the fusing segment is sufficiently small so that the fusing current therethrough is less than 20 milliamperes. The fuse and surrounding circuitry is covered with a passivation layer and contacts formed in the passivation layer to the expanded segments.

20 Claims, 3 Drawing Sheets

MOS PROGRAMMABLE MEMORIES USING A METAL FUSE LINK AND PROCESS FOR MAKING THE SAME

BACKGROUND OF THE INVENTION

The present invention relates to a process for forming MOS programmable memory elements using metal fuse links.

Devices used to provide programmable memory elements in MOS processes have included the electrically programmable read only memory cell (EPROM) or the erasable electrically programmable read only memory cell (EEPROM). Such non-volatile memory elements are generally costly to fabricate. For example, the EPROM requires each chip to be erased at least two separate times during fabrication. This involves a large amount of process time. An additional problem with these devices aside from their relatively complex processing resides in the amount of chip area each of them occupies. With present day technology each EPROM takes up at least about 20 square microns and an EEPROM at least 200 or more square microns depending on cell design.

Fuse links have been used in MOS design but these have been of polysilicon. Polysilicon fuses require a hole in the passivation layer so that the gases released upon "blowing" of the fuse can escape. Such openings expose the chip to potential corrosion through the opening. A second problem with polysilicon fuses is that they are not compatible with plastic packages and to date have only been built with reliable yields in the relatively costly ceramic package.

Metal fuse links have been used in bipolar processes but such processes involve different oxides and larger layouts and are capable of absorbing larger currents than MOS devices. It has not been necessary therefore to attempt to design a fuse which "blows" with currents less than about 25 milliamperes as would be required by MOS devices. Even if lower fusing currents are possible it is not known whether such fuses could be manufactured without the objectionable opening in the passivation layer necessary for polysilicon fuses. Another problem with using fuse links in MOS processes resides in the fact that MOS circuits are significantly more sensitive to contamination such as that from etching of the fuse link metal. Finally, it has not been known whether deposition techniques for suitable fuse metals used in bipolar processes would be applicable to MOS processes.

Accordingly, it is an object of the present invention to provide an improved process for producing programmable memories in MOS processes. It is a further object of the invention to provide a process for making a metal fuse link in an MOS process.

SUMMARY OF THE INVENTION

According to the invention there is provided a process for making a metal fuse link in a MOS or CMOS process which includes depositing a refractory metal or metal alloy over an already deposited multi-level oxide and patterning the deposited metal or metal alloy so that it has a fusing segment between and integral with expanded segments such that the length and cross sectional area of the fusing segment is sufficiently small so that the fusing current therethrough is less than 20 milliamperes. The fuse and surrounding circuitry is covered with a passivation layer and contacts formed in the passivation layer to the expanded segments. Means are provided for driving fusing current through the fuse link to melt the fusing segment thereof.

Preferably the metal fuse link is a refractory metal alloy having a resistance over the length of the fuse segment of about 150 ohms and the fusing segment is a region of narrowed width compared to that of the expanded segments. A suitable metal alloy is titanium-tungsten.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 5 is the view taken along line XX.

DETAILED DESCRIPTION WITH REFERENCE TO THE DRAWINGS

Figure 1:
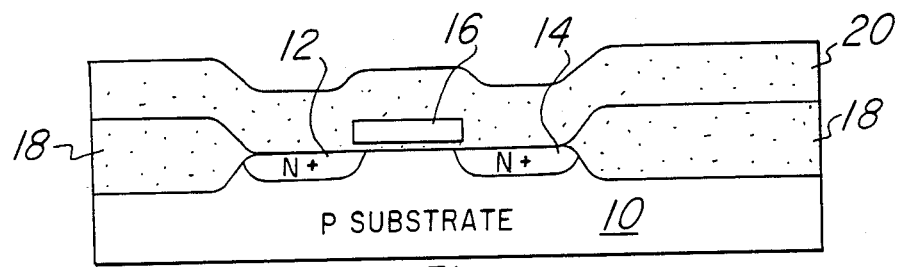
FIGS. 1-5 are greatly enlarged cross sectional views showing the various manufacturing stages of a fuse link and an associated field effect transistor used to drive current through the fuse link.

Referring to FIG. 1 there is shown a field effect transistor made according to conventional techniques which includes a diffused N+ type source 12 region, a corresponding drain region 14 and a gate 16. The source 12 and drain 14 are bounded by thick field oxide regions 18 of about 10,000 Angstroms thick formed in an oven in the presence of steam at a temperature in the range of about 900°–1,000° C. Gate 16 of doped polysilicon and the remaining area are covered by a thick multi-level oxide 20 such as, for example, a phospho-silicate glass, having a thickness of about 10,000 Angstroms. This layer 20 may be planarized by spinning on a photoresist (not shown) to form a flat top surface and etching back with an etchant that etches the multi-level oxide 20 and the photoresist at essentially the same rate.

Figure 2:
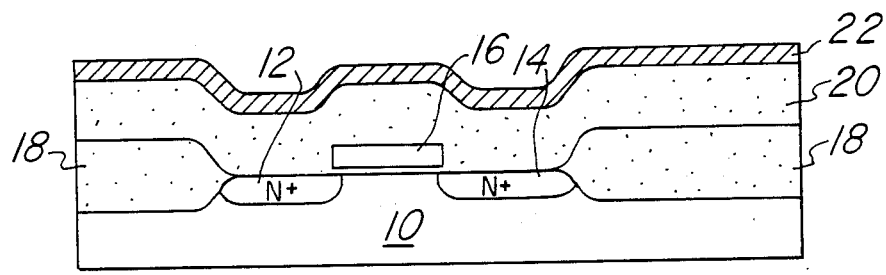
Figure 3:
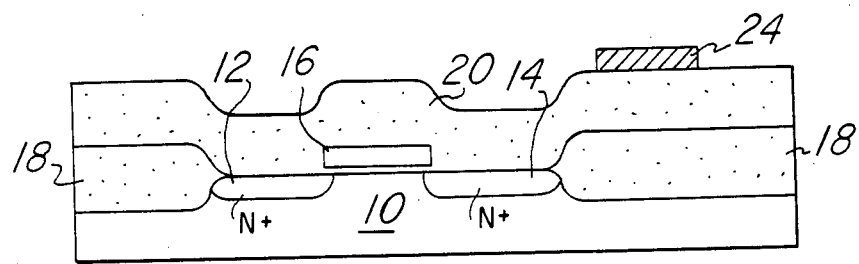
Figure 4:
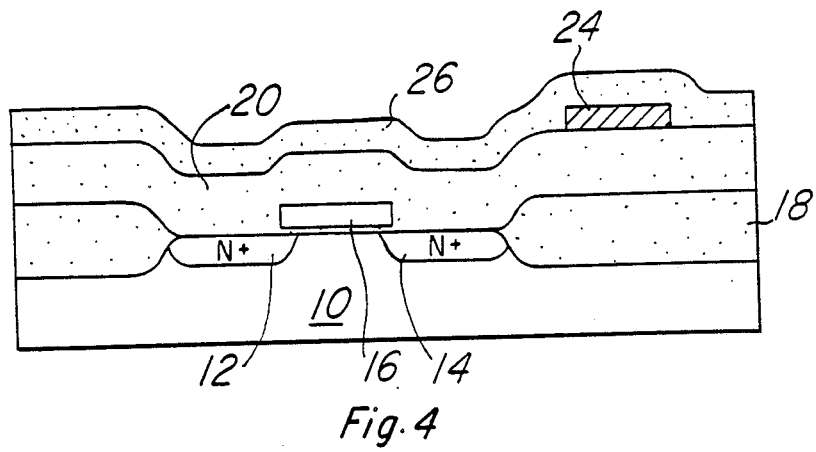
Figure 6:
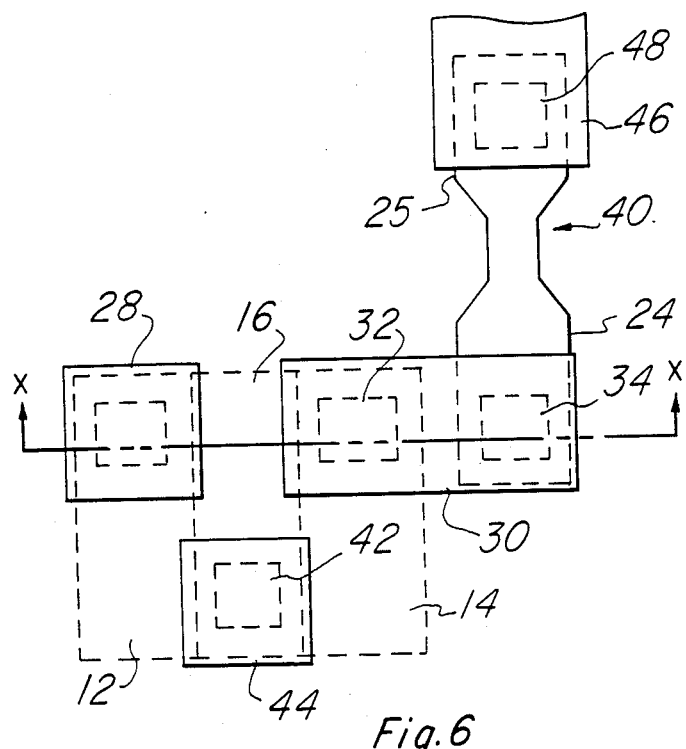
FIG. 6 is a plan view showing the layout of the fuse link and the corresponding transistor used to drive current through the fuse link.

Next titanium-tungsten alloy 22 is sputtered over the surface of the multi-level oxide 20 to a thickness of about 450 Angstoms as seen in FIG. 2 and then patterned and etched as shown in FIGS. 3 and 6. The patterning is such that a mask of 1.8 microns is used in a fusing segment 40 in conjunction with a wet etch of 30% hydrogen peroxide at 40° C. for about 5 minutes. Undercutting of the titanium tungsten 22 takes place during the etch so that a final width of 1 micron occurs at the fusing segment 40. The length of the fusing segment is also kept at about 1 micron although fuse lengths of 3 microns have been found to operate satisfactorily. The photoresist (not shown) is then cleaned off and an interlevel oxide being a plasma oxide chemical vapor deposition 26 is made to a thickness of about 3,000 Angstroms.

A further photoresist (not shown) is deposited and patterned to first open contacts to the expanded segments 24 and 25 of the titanium tungsten. Next contacts are opened to the source 12 and the drain 14 and to any other contacts on the face of the semiconductor slice (see FIG. 6) of the fuse link. It is important to note that contamination from the titanium tungsten such as sodium can have a serious effect on the transistor and other circuit components if allowed to contaminate the source/drain regions. It is for this reason that the etch to the expanded segments is done before that to the other contacts.

Figure 5:
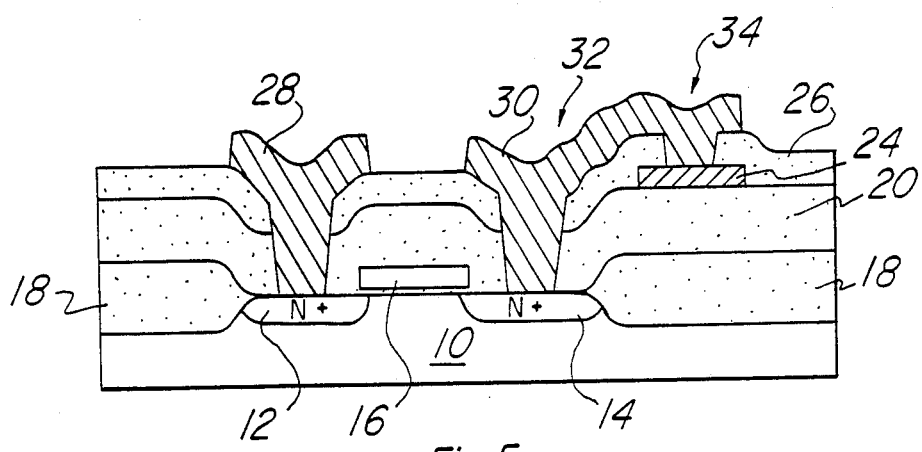
Figure 7:
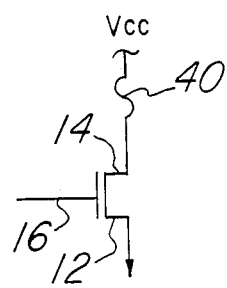
FIG. 7 is an equivalent circuit for the structure of FIGS. 5 and 6.

A layer of aluminum is deposited over the slice and patterned and dry etched by a reactive ion etch to form contacts 28 and 30. The interlevel oxide 26 serves to protect the titanium tungsten from being eroded by the etch. Contact 30 is made up of a contact 32 to the drain 14 and contact 34 to the titanium-tungsten fuse 24. A gate contact 44 shown in FIG. 6 but not shown in FIGS. 5 is also formed. These contacts generally run to other areas of the circuit but are shown to end around the contact areas for convenience. An equivalent circuit for the structure of FIG. 5 and 6 is shown in FIG. 7. However, clearly any circuit for supplying a controlled amount of current through the fuse segment 40 is acceptable.

It has been found that the current required to blow the fuses whose width is 1.0 microns in with with a titanium tungsten film thickness of 475 Angstroms is $11\pm1.5$ milliamperes without any inter-level oxide deposition. When 3,000 Angstroms of oxide and 10,000 Angstroms of compressive nitride plasma oxide are deposited the blowing current shifts to $22.5\pm2.5$ milliamperes. The Heat dissipated per unit volume is given by the following formula, $$Q/v = I^2 R/v = I^2/(A \times L) \times P \times L/A = P \times (I/w \times t)^2$$

where P is the specific resistivity, W is the fuse width, t is the fuse thickness, A is the cross sectional area of the fuse segment and I is the fuse blowing current. The fuse blowing current can therefore be reduced by reducing the thickness of the titanium-tungsten or by making the fuse segment narrower.

It has been found that with the fusing current reduced to a magnitude of the order of 10 milliamperes no damage is done to the oxide around the fuse segment when the latter melts. On melting moreover, it has been noted that the broken ends of the fuse link pull away from one another possibly due to the surface tension of the metal.

It will be appreciated that the extremely small dimensions possible with such a simple structure make such a fuse link an attractive alternative to the larger more costly types of programmable memories available.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A method of making a one time programmable memory element on a face of semiconductor chip in a MOS or CMOS process comprising:
    forming a multi-level oxide over the face;
    depositing a layer of refractory metal over said multi-level oxide;
    patterning and etching the refractory metal so as to form a fusing segment between and integral with spaced apart expanded segments of the metal such that the cross sectional area of the fusing segment is such that the current which melts the fusing segment is less than 25 milliamperes; and
    depositing over the face a passivating layer of insulating material;
    forming contact openings to the expanded regions;
    forming contact openings to other contacts of the chip; and
    depositing and patterning contact metal over the face.

2. A method according to claim 1, wherein the fuse metal is a refractory metal or refractory metal alloy.

3. A method according to claim 2, wherein the resistance of the fuse segment is less than 200 ohms.

4. A method according to claim 2, wherein the fuse metal is titanium tungsten.

5. A method according to claim 4, wherein the thickness of the titanium tungsten is about 450 Angstroms and the width of the fuse segment is in the range of 0.6 to 2.0 microns.

6. A method of forming a metal fuse link on a face of a semiconductor body in a MOS or CMOS process, comprising:
    forming a multi-level oxide over the face;
    depositing a refractory metal over said multi-level oxide with a thickness in the range of 400 to 500 Angstroms;
    patterning the metal so that it forms a length of fusing segment with a width less than 2 microns and a length of less than 3 microns joined at either end by expanded segments of the metal;
    depositing a passivation layer of insulator over the face;
    etching contacts in the passivation layer to the expanded segments;
    etching contacts to the remaining contacts in the circuit.

7. A method according to claim 6, wherein the metal is titanium tungsten.

8. A fuse link in a MOS or CMOS device formed over a face of a semiconductor body, comprising:
    a layer of multi-level oxide over the face of a semiconductor body;
    a refractory metal fuse layer formed over a field oxide region of the multi-level oxide having a fuse segment with a resistance less than about 200 ohms integral with and between two spaced apart expanded regions; and
    an interlevel passivation layer over said fuse layer;
    an electrical contact integral with the MOS or CMOS device and extending through said passivation layer for contacting said fuse segment and carrying fusing current to said fusing segment.

9. The fuse link of claim 8 where the electrical contact is in contact with one of the expanded regions.

10. The fuse link of claim 8 wherein the metal fuse layer is titanium tungsten.

11. The fuse link of claim 8 wherein the fuse segment has a cross sectional area of such size to melt the fuse segment when current delivered to said segment is less than 25 milliamps.

12. The fuse link of claim 8 wherein the fuse segment is electrically connected to said MOS or CMOS device.

13. The fuse link of claim 12 wherein the fuse segment is in series electrical connection with said MOS or CMOS device.

14. The fuse link of claim 9 wherein the electrical contact is electrically connected to said MOS or CMOS device.

15. The fuse link of claim 14 wherein the electrical contact is in series electrical connection with said MOS or CMOS device.

16. The fuse link of claim 8 wherein the MOS or CMOS device provides the fusing current for melting the fuse segment.

17. A fuse link in a MOS or CMOS device formed over the face of a semiconductor body, comprising:
   a current carrying terminal connected to said MOS or CMOS device;
   a layer of multi-level oxide over the face of a semiconductor;
   a refractory metal fuse formed over a field oxide region of the multi-level oxide having a fuse segment with a resistance less that 200 ohms intergral with and between two spaced apart expanded regions;
   an interlevel passivation layer over said fuse;
   an electrical contact extending through said passivation layer and electrically connected to said current carrying terminal for carrying a fusing current from said MOS or CMOS device to said fuse segment.

18. The fuse link of claim 17 wherein the terminal and the contact are connected in series.

19. The fuse link of claim 18 wherein the terminal and the contact are integrally formed.

20. The fuse link of claim 17 wherein the fuse link is titanium tungsten.

* * * * *